May 12, 1970 MASAYA OHTA 3,511,724

METHOD OF MAKING SEMICONDUCTOR DEVICES

Filed April 21, 1967 2 Sheets-Sheet 1

INVENTOR
MASAYA OHTA

BY PAUL M. CRAIG, JR.
ATTORNEY

METHOD OF MAKING SEMICONDUCTOR DEVICES

Filed April 21, 1967

INVENTOR
MASAYA OHTA

BY PAUL M. CRAIG, JR.
ATTORNEY

United States Patent Office 3,511,724

Patented May 12, 1970

3,511,724

METHOD OF MAKING SEMICONDUCTOR DEVICES

Masaya Ohta, Tokyo, Japan, assignor to Hitachi, Ltd., Tokyo, Japan, a corporation of Japan Filed Apr. 21, 1967, Ser. No. 632,701
Claims priority, application Japan, Apr. 27, 1966, 41/26,301
Int. Cl. H01l 7/44
U.S. Cl. 148—187 25 Claims

ABSTRACT OF THE DISCLOSURE

A method of making semiconductor devices such as transistors having such a structure that a region of high impurity concentration and of the same conductivity type as that of the base region is provided in the base region of the transistor in order to reduce the base spreading resistance. Two different kinds of impurities having the same conductivity type but having different diffusion velocities are employed, and the impurity having the lower diffusion velocity is first diffused and then the impurity having the higher diffusion velocity is diffused to form the base region and the region of high impurity concentration.

BACKGROUND OF THE INVENTION

Field of the invention

This invention relates to a method of making semiconductor devices, and more particularly to a method of making a semiconductor device having a high conductance region which is provided in the surface of the substrate in order to reduce the spreading resistance existing in that portion of the semiconductor substrate ranging from the operation region to the electrode depositing portion.

Description of the prior art

It is generally desired that the spreading resistance existing in a range from the operation region of a semiconductor device through the interior of the semiconductor substrate to the electrode depositing portion is as small as possible, and in order to attain the above purpose, it is common practice to form a high conductance region in a predetermined portion of the substrate and to deposit the electrode at such high conductance region. In a transistor made according to prior practice, the transistor has a high conductance region 3 as, for example, shown in FIG. 1. The transistor shown in FIG. 1 includes therein a collector region 1, a base region 2, an emitter region 4, an insulating surface coating 5 covering the surface of the semiconductor, a base electrode 6, an emitter electrode 7, and an emitter junction 8 acting as the operation region in this transistor.

In the prior art practice, the transistor of the above kind has been made by the steps as shown in FIGS. 2*a* to 2*c*. More precisely, an n-type silicon substrate 1 polished to a mirror finish is first prepared and a silicon oxide ($SiO_2$) film 9 is formed on the mirror-like surface of the substrate 1 as shown in FIG. 2*a*. A hole 10 extending to the substrate surface is then formed through a predetermined portion of the silicon oxide film 9, and a p-type impurity, such as boron, is selectively diffused at a high impurity concentration to a shallow depth through the hole 10 to form a $p^+$-type diffused region 11 in the substrate 1. In this example, the hole 10 is of annular shape and hence the region 11 is also formed as an annular region. A silicon oxide film is newly formed in the hole 10 since the impurity diffusion is performed in an oxidizing atmosphere.

A hole 12 is then formed through the silicon oxide film as shown in FIG. 2*b* and the same p-type impurity, boron, is again selectively diffused through this hole 12 to form a p-type base region 2. During this impurity diffusion, the impurity in the $p^+$-type region 11 having been previously diffused is stretch-diffused to form a $p^+$-type region 3, and a silicon oxide film 13 is again formed on the surface of the p-type base region 2 and the $p^+$-type region 3.

Then, a hole 14 extending to the base region 2 is formed through the silicon oxide film 13 as shown in FIG. 2*c* and an n-type impurity is diffused through this hole 14 to form an emitter region 4. A silicon oxide film 15 is again formed in the hole 14.

Finally, holes extending to the annular $p^+$-type region 3 and the emitter region 4 are formed through the silicon oxide films 13 and 15, respectively, and electrodes 6 and 7 are brought into ohmic contact with regions 3 and 4, respectively, to obtain a transistor having a structure as shown in FIG. 1.

In the conventional transistor made by the steps as described above, region 3 has been formed prior to the formation of the region 2 and the same impurity is used in forming both these regions. Due to the above manner of manufacture, it has been unavoidable in the conventional transistor that diffusion of the impurity forming the region 3 takes place during the formation of region 2, with the result that the impurity concentration of region 3 is lowered and the conductance of region 3 is thereby lowered to a value which is not appreciably different from the conductance of region 2. Owing to the above fact, it has been difficult to sufficiently attain the primary purpose of reducing the base spreading resistance existing in the range from the base electrode 6 to the operation region 8 of the emitter junction.

SUMMARY OF THE INVENTION

The present invention contemplates to eliminate the prior defects described above and to provide a novel method of making a semiconductor device which is characterized by the fact that two different kinds of impurities having the same conductivity type but having different diffusion velocities, or different diffusion coefficients, are employed to separately form regions 2 and 3 described above and are so diffused that the impurity having the lower velocity of diffusion is diffused first and the impurity having the higher velocity of diffusion is then diffused to attain the desired result.

It is possible by application of the method according to the present invention to make semiconductor devices such as transistors or semiconductor integrated circuits having excellent operating characteristics.

It is therefore the primary obect of the present invention to provide a novel and improved method of making a semiconductor device having a high conductance region in its semiconductor substrate.

One of the more practical objects of the present invention is to provide a novel method of making a transistor having excellent operating characteristics.

Another practical object of the present invention is to provide a method of making a transistor having a small base spreading resistance.

The above and other objects, advantages and features of the present invention will become apparent from the following description with reference to the accompanying drawings:

1 at successive steps of manufacture by the prior art method.

Figure 1:
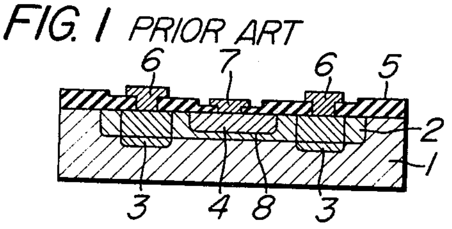
FIG. 1 PRIOR ART
FIG. 1 is a greatly enlarged schematic transverse sectional view of a planar transistor made by the prior method as described previously.
Figure 3:
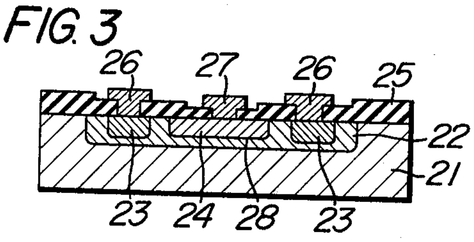
Figure 2A:
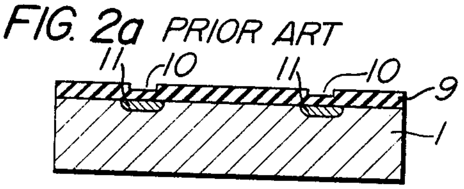
FIG. 2a PRIOR ART
FIGS. 2*a* to 2*c* are a series of greatly enlarged schematic transverse sectional views showing the transistor in FIG.

FIG. 3 is a greatly enlarged schematic transverse sectional view of a semiconductor device made by the method according to the present invention.

Figure 4A:
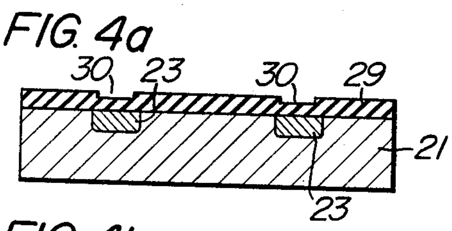
Figure 2B:
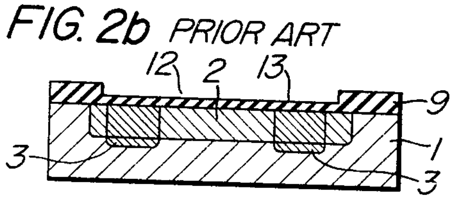
FIG. 2b PRIOR ART
Figure 4B:
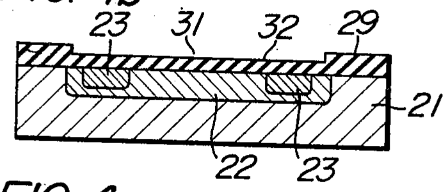
Figure 2C:
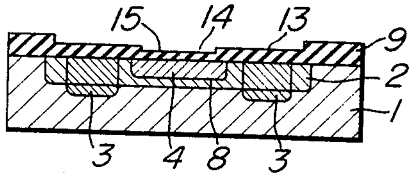
FIG. 2c PRIOR ART
Figure 4C:
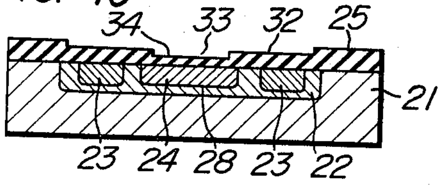

FIGS. 4a to 4c are a series of greatly enlarged schematic transverse sectional views showing the semi-conductor device in FIG. 3 at successive steps of manufacture by the method of the present invention.

FIGS. 5a to 5d are a series of greatly enlarged schematic transverse sectional views showing the semiconductor device in FIG. 3 at other successive steps of manufacture by the method of the present invention.

Figure 6A:
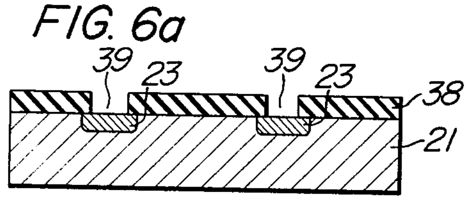
Figure 6B:
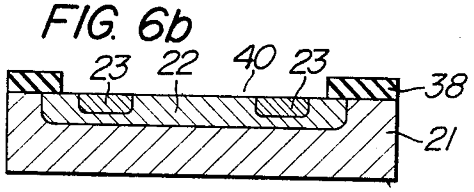
Figure 6C:
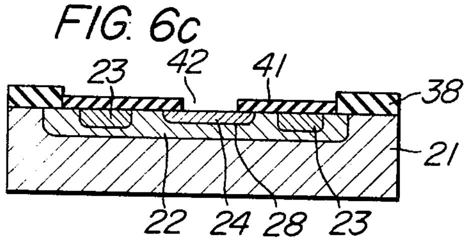

FIGS. 6a to 6c are a series of greatly enlarged schematic transverse sectional views showing the semiconductor device in FIG. 3 at still other successive steps of manufacture by the method of the present invention.

Figure 7A:
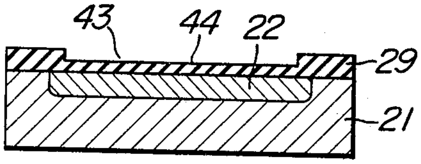
Figure 7B:
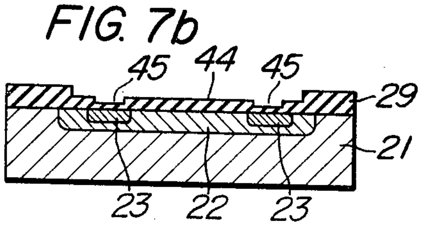
Figure 7C:
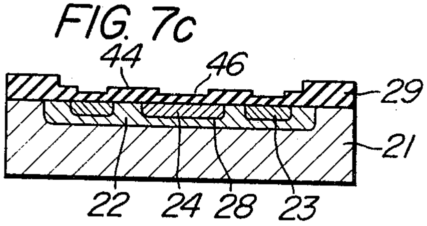

FIGS. 7a to 7c are a series of greatly enlarged schematic transverse sectional views showing the semiconductor device in FIG. 3 at further successive steps of manufacture by the method of the present invention.

Figure 8A:
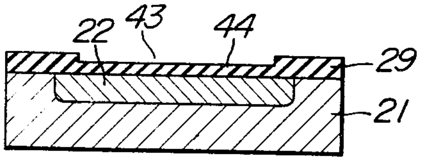
Figure 8B:
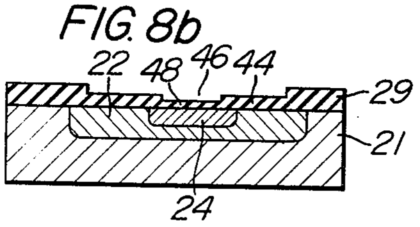
Figure 8C:
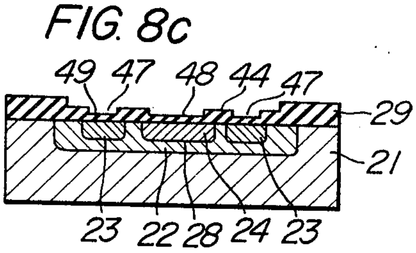

FIGS. 8a to 8c are a series of greatly enlarged schematic transverse sectional views showing the semiconductor device in FIG. 3 at other successive steps of manufacture by the method of the present invention.

DESCRIPTION OF THE PREFERRED EMBODIMENTS

In FIG. 3, there is shown a semiconductor device made by the method according to the present invention. Suppose now that this semiconductor device is constructed to operate as a transistor. The transistor includes therein a collector region 21, a base region 22, a high conductance region 23 disposed in the base region 22, an emitter region 24, an insulating surface coating 25 covering the semiconductor surface, a base electrode 26, an emitter electrode 27, and an emitter junction 28 which acts as the operation region of this transistor.

The steps of manufacture of a semiconductor device such as a transistor having such a structure by the method of the present invention will be described in detail hereunder.

Example 1

An n-type silicon substrate 21 having its surface polished to a mirror finish is first prepared, and a masking film 29 consisting of silicon compound, for example silicon oxide, of a thickness of 8,000 to 10,000 A. is formed on the mirror-like surface of the substrate 21 as shown in FIG. 4a. An annular hole 30 is formed through the masking film 29, and a p-type impurity such as indium is selectively annularly diffused through the hole 30 into the substrate 21 under the diffusion conditions, that is, at a diffusion temperature of about 1,250° C. with a diffusion duration of about 8 hours, to form a high conductance region 23 having a depth of about 5 microns. In one example, the surface impurity concentration of the region 23 was $10^{19}$ cm.$^{-3}$.

Then, as shown in FIG. 4b, a hole 31 is formed through the silicon oxide film 29 to expose that portion of the semiconductor surface, and a p-type impurity such as boron having a greater diffusion coefficient, or velocity than the indium is diffused through the hole 31 to form a base region 22 having a depth of about 6 microns. In one example, the surface impurity concentration of the base region 22 was $5\times10^{17}$ cm.$^{-3}$ when the diffusion was performed at a temperature of about 1,250° C. for about 2 hours. Owing to the lower diffusion coefficient of indium, as compared with that of boron, the degree of indium diffusion during the diffusion of boron is quite small, and therefore the impurity concentration of the region 23 would not be reduced to an appreciable extent. While the indium impurity is being diffused in the above manner, a film 32 of silicon oxide of a thickness of about 4,000 A. is formed in hole 31.

Then as shown in FIG. 4c, a hole 33 is formed through a portion of the silicon oxide film 32, and an n-type impurity such as phosphorus is selectively diffused through hole 33 at a temperature of about 1,100° C. for about 10 minutes to form an n-type diffused emitter region 24 having a depth of about 2 microns which is surrounded by the annular $p^+$-type region 23. During the diffusion of phosphorus, a film 34 consisting mainly of silicon oxide is formed in hole 33.

Holes extending to the high conductance region 23 and the emitter region 24 are then formed through the silicon oxide films 32 and 34, respectively, and an electrode metal, preferably aluminum, is deposited through these holes to provide a base electrode 26 and an emitter electrode 27 as shown in FIG. 3. It is thus possible to make a transistor having the structure as shown in FIG. 3 by the above steps.

Example 2

The impurity used to form the p-type region 22 may be gallium instead of the boron impurity referred to in employing a silicon oxide film as a mask as described in the above example is not applicable to gallium since the gallium impurity is not masked by such silicon oxide film. However, gallium is applicable to a transistor structure of the so-called mesa type.

One form of the method of the invention for making a mesa type transistor by gallium diffusion will be described with reference to FIGS. 5a to 5d, in which like reference numerals appearing in FIGS. 4a to 4c are used to denote like parts.

Figure 5A:
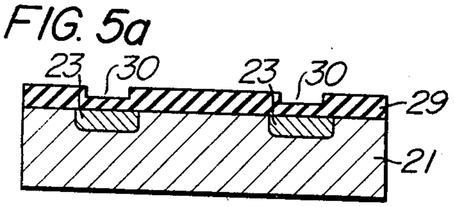

FIG. 5a is similar to FIG. 4a, and in FIG. 5a it will be seen that a silicon oxide film 29 about 8,000 A. thick having a hole 30 is provided on the surface of an n-type silicon substrate 21. Indium is diffused through this hole 30 at a temperature of about 1,200° C. for about 4 hours to a depth of about 3 microns to form a $p^+$-type region 23 in the substrate 21.

Gallium is then diffused from the semiconductor surface at a temperature of about 1,100° C. for about 3 hours. Since in this case the gallium impurity is not masked by the silicon oxide film 29, a p-type gallium diffused region 22 extending to a depth of about 5 microns from the substrate surface is formed in the substrate 21 as shown in FIG. 5b.

Figure 5C:
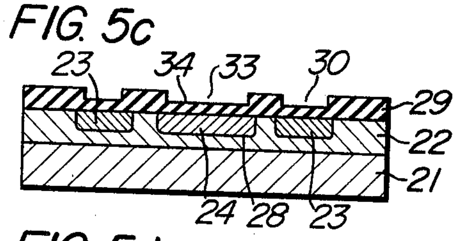
Figure 5B:
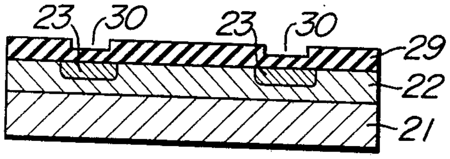

Then, as shown in FIG. 5c, a hole 33 is formed through a portion of the silicon oxide film 29, and phosphorus is diffused through this hole 33 into the semiconductor substrate 21 at a temperature of about 1,100° C. for about 30 minutes to form an n-type emitter region 24 having a depth of about 2 to 3 microns. During the diffusion of phosphorus, a film 34 consisting mainly of silicon oxide is newly formed in the above hole 33.

Figure 5D:
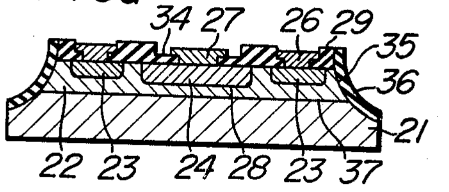

Subsequently, by use of the conventional mesa forming technique, a mesa portion 35 is formed by etching that portion of the semiconductor substrate 21 ranging from the semiconductor surface to a p-n junction 37 between the n-type region 21 and the p-type region 22 as shown in FIG. 5d. If desired, a surface protecting film 36 may be provided as shown on the semiconductor surface which has been exposed by the etching treatment in the mesa forming step. Holes are then formed through the insulating films on the $p^+$-type region 23 and the n-type emitter region 24, and electrodes 26 and 27 are deposited in these holes to provide a mesa type transistor.

Example 3

Gallium can be selectively diffused by employing a silicon nitride film as a mask in lieu of the silicon oxide film in the above Example 2 since the silicon nitride film has a masking effect to gallium. One form of the method of the invention for making a transistor by use of a mask which is a silicon nitride film will be described with reference to FIGS. 6a to 6c.

At first, as shown in FIG. 6a, a silicon nitride film 38 about 2,000 A. thick is deposited on an n-tppe silicon substrate 21. The silicon nitride film 38 can be deposited by causing a mixture of silane ($SiH_4$) and ammonia ($NH_3$) entrained on a carrier gas, for example hydrogen gas, to flow over the substrate 21 and heating them to a temperature of about 1,100° C. to cause the reaction between the silane and ammonia. An etching technique may be employed to form a first opening 39 through the silicon nitride film 38. Indium is then diffused through this opening 39 into the substrate 21 at a temperature of about 1,200 ° C. for about 4 hours to form a $p^+$-type region 23 having a depth of about 3 microns.

Then, as shown in FIG. 6*b*, a second opening 40 having an area larger than that of said first opening is formed through the silicon nitride film 38 so as to completely expose the above $p^+$-type region 23, and gallium is caused to diffuse from the semiconductor surface at a temperature of about 1,100°C., for about 3 hours. Since, during this gallium diffusion, the gallium impurity is masked by the silicon nitride film 38, the gallium impurity is selectively diffused to form a p-type region 22 having a depth of about 5 microns as shown.

Thereafter, as shown in FIG. 6*c*, a silicon oxide film 41 about 4,000 to 6,000 A. thick is formed in the above opening 40. A third opening 42 is formed through the silicon oxide film 41, and phosphorus is diffused through this third opening 42 into the substrate 21 at a temperature of about 1,100° C. for about 30 minutes to form an n-type emitter region 24. Electrodes are then deposited as in the case of the previous Examples 1 and 2. An npn transistor whose p-n junction between the base and the collector is covered with the silicon nitride film, can thus be made by the above steps.

In the above Examples 1, 2 and 3, the present invention has been described with regard to various forms of the method of making a semiconductor device according to which a high conductance region, that is, a high impurity concentration region is formed by diffusion of an impurity having a relatively low velocity of diffusion and then an impurity of the same conductivity type as that of the former impurity but having a higher velocity of diffusion than the former is diffused to effectively reduce the spreading resistance in the semiconductor. However, it will be understood that the method of the present invention is in no way limited to the specific examples as described above, and a different manner of making such semiconductor devices may be employed without departing from the spirit and scope of the invention.

Example 4

In FIGS. 7*a* to 7*c*, there is shown an exemplary process of making a transistor which includes the steps of first diffusing an impurity having a low velocity of diffusion to form a base region of the transistor, and then diffusing an impurity of the same conductivity type as that of the former impurity but having a higher velocity of diffusion to form a high conductance region in the base region.

More precisely, a silicon oxide film 29 about 8,000 to 10,000 A. thick having a hole 43 is provided on the surface on an n-type silicon substrate 21 as shown in FIG. 7*a*. Indium is diffused through this hole 43 into the substrate 21 at a temperature of about 1,200° C. for about 8 hours to form a p-type base region 22 having a depth of about 5 microns. During the diffusion of indium, a thin silicon oxide film 44 about 4,000 A. thick is formed in the above hole 43.

Then, as shown in FIG. 7*b*, an annular hole 45 is formed through the newly formed silicon oxide film 44, and boron is diffused through this hole 45 at a temperature of about 1,200° C. for about 2 hours to form a $p^+$-type region 23 having a depth of about 2 microns. A hole 46 is then formed through a portion of the silicon oxide film 44 as shown in FIG. 7*c*, and phosphorus is diffused through this hole 46 at a temperature of about 1,100° C. for about 30 minutes to form an n-type emitter region 24. Metal electrodes are then deposited at necessary portions as in the previous examples to obtain an npn transistor.

The above Examples 1 to 4 have referred to methods of making an npn transistor in which a high impurity concentration region is formed in the p-type base region. There may be a variety of combinations of p-type impurities for forming these regions, but in selecting suitable impurities due consideration should be given to the diffusion velocity of each impurity to determine an optimum combination of such impurities. For reference, typical p-type impurities suitable for diffusion into a silicon substrate are, in the order of higher to lower velocity of diffusion aluminum, gallium, boron and indium or thallium.

It is needless to say that the method according to the present invention is also applicable to form an n-type base region of a pnp transistor. However, in selecting suitable n-type impurities, determination should be made taking into account the diffusion velocities of respective impurities. For reference, typical-n-type impurities suitable for diffusion into a silicon substrate are, in the order of higher to lower velocity of diffusion, phosphorus, antimony or arsenic, and bismuth.

Example 5

Referring to FIGS. 8*a* to 8*c*, a preferred method of making a pnp transistor having an $n^+$-type region (high conductance region) in an n-type base region will be described.

First, in FIG. 8*a*, a silicon oxide film 29 about 8,000 to 10,000 A. thick is provided on the surface of a p-type silicon substrate 21. A hole 43 extending to the substrate 21 is formed through this silicon oxide film 29, and antimony is diffused through this hole 43 into the substrate 21 to form an n-type diffused region 22 having a depth of about 3 microns. During the diffusion of antimony, a thin silicon oxide film 44 about 4,000 A. thick is formed on that surface portion of the diffused region 22 which lies within this hole 43. The diffusion of the antimony impurity is effected by depositing antimony on the substrate surface by heating at about 1,100° C. for about 15 minutes and then subjecting the antimony deposit to a heat treatment at about 1,200° C. for about 3 hours to cause diffusion of the deposited antimony into the substrate.

Then, as shown in FIG. 8*b*, a second hole 46 is formed through the newly formed silicon oxide film 44, and boron is diffused through this hole 46 into the substrate 21 to form a p-type emitter region 24 having a depth of about 1 micron. The diffusion of the boron impurity is effected by depositing boron on the substrate surface by heating at about 1,030° C. for about 1 hour and then subjecting the boron deposit to a heat treatment at about 1,000° C. for about 15 minutes to cause diffusion of the deposited boron into the substrate. During the diffusion of boron, a silicon oxide film 48 is formed on that surface portion of the diffused region 24 which lies within the second hole 46.

A third hole 47 of annular shape is then formed through a portion of the silicon oxide film 44 as shown in FIG. 8*c*, and phosphorus is diffused through this hole 47 into the substrate 21 to form an n-type high impurity concentration region 23 having a depth of about 1 to 2 microns. The diffusion of the phosphorus impurity is effected by the steps of depositing phosphorus on the substrate surface by heating at about 1,025° C. for about 5 minutes and then subjecting the phosphorus deposit to a heat treatment at about 1,000° C. for about 5 minutes to cause diffusion of the deposited phosphorus into the substrate. During the diffusion of phosphorus, a film 49 consisting mainly of silicon oxide is formed on that portion of the substrate surface which lies within the third hole 47. Fourth and fifth holes are then formed through the silicon oxide films as in the previous examples, and metal electrodes are deposited on the substrate surface through these holes to make a pnp transistor.

The above examples have been described with regard to the specific case of using silicon as a substrate material, but it will be understood that germanium or another semiconductor may be employed as a substrate material in lieu of silicon, in which case the method according to the present invention can be practised by properly selecting those impurities which are suitable for use with a specific substrate material. It is needless to say that the method of the present invention is likewise effectively applicable to the manufacture of diodes or semiconductor integrated circuits in addition to the manufacture of various transistors.

What is claimed is:

1. In a method comprising forming a semiconductor device having a semiconductor substrate, a first region of a first conductivity type formed in said semiconductor substrate, a second region formed in said semiconductor substrate as a continuous part of said first region, said second region having the same conductivity type as that of said first region but having a higher conductance than that of said first region, and a third region of a second conductivity type formed in said first region so as to define a PN junction with said first region, the improvement comprising:

diffusing a first impurity having said first conductivity type into said semiconductor substrate to form one of said first and second regions;

then diffusing a second impurity having the same conductivity type as said first impurity, and a higher diffusion velocity than said first impurity, into said semiconductor substrate to form the other of said first and second regions.

2. A method according to claim 1, wherein said step of diffusing the third impurity is carried out before said step of diffusing the second impurity.

3. A method of making a semiconductor device according to claim 1, in which said second region is formed by the diffusion of said first impurity, and said first region is formed by the diffusion of said second impurity.

4. A method of making a semiconductor device according to claim 1, in which said first region is formed by the diffusion of said first impurity, and said second region is formed by the diffusion of said second impurity.

5. In the method of claim 1 the improvement additionally comprising:

diffusing a third impurity having said second conductivity type into said first region to form said third region.

6. In a method comprising forming a semiconductor device having a semiconductor substrate, a first region of a first conductivity type formed in said semiconductor substrate, a second region formed in said semiconductor substrate as a continuous part of said first region said second region having the same conductivity type as that of said first region but having a higher conductance than that of said first region, and a third region of a seocnd conductivity type formed in said first region so as to define a PN junction with said first region, the improvement comprising:

providing on the surface of said semiconductor substrate an insulating surface coating having a first hole extending to the surface of said semiconductor substrate;

then diffusing a first impurity having said first conductivity type through said first hole into said semiconductor substrate to form said second region;

then forming through said surface coating a second hole extending to the surface of said semiconductor substrate including said first hole and having an area larger than said first hole;

then diffusing a second impurity having the same conductivity type as said first impurity and having a higher diffusion velocity than that of said first impurity through said second hole into said semiconductor substrate to form said first region.

7. A method of making a semiconductor device according to claim 6, in which said semiconductor substrate is made from silicon, and said insulating surface coating consists of silicon compound.

8. A method of making a semiconductor device according to claim 6, in which said semiconductor substrate is made from silicon, said insulating surface coating consists mainly of silicon oxide, said first impurity is indium, and said second impurity is boron.

9. A method of making a semiconductor device according to claim 6, in which said semiconductor substrate is made from silicon, and said insulating surface coating consists mainly of silicon nitride.

10. A method of making a semiconductor device according to claim 9, in which said second impurity is gallium.

11. In the method of claim 6, the improvement additionally comprising:

forming in said second hole an insulating surface coating to cover said first and second regions, said insulating coating having a third hole extending to said semiconductor substrate and exposing said first region;

then diffusing a third impurity having said second conductivity type through said third hole said first region to form said third region.

12. In a method comprising forming a semiconductor device having a semiconductor substrate, a first region of a first conductivity type formed in said semiconductor substrate, a second region formed in said semiconductor substrate as a continuous part of said first region, said second region having the same conductivity type as that of said first region but having a higher conductance than that of said first region, and a third region of a second conductivity type formed in said first region so as to define a PN junction with said first region, the improvement comprising:

providing on the surface of said semiconductor substrate an insulating surface coating having at least one hole extending to the surface of said semiconductor substrate;

diffusing a first impurity determining said first conductivity type through said hole into said semiconductor substrate thereby forming said second region;

diffusing a second impurity determining said first conductivity type and having a higher diffusion velocity than that of said first impurity and which is not masked by said surface coating through said surface coating and into said semiconductor substrate thereby forming said first region.

13. A method of making a semiconductor device according to claim 12, in which said semiconductor substrate is made from silicon, and said insulating surface coating consists mainly of silicon oxide.

14. A method of making a semiconductor device according to claim 12, in which said semiconductor substrate is made from silicon, said insulating surface coating consists mainly of silicon oxide, and said second impurity is gallium.

15. In the method of claim 12, the improvement additionally comprising forming in said insulating surface coating a second hole extending to said first region;

selectively diffusing a third impurity determining said second conductivity type through said second hole into said first region to form said third region.

16. In a method comprising forming a semiconductor device having a semiconductor substrate, a first region of a first conductivity type formed in said semiconductor substrate, a second region formed in said semiconductor substrate as a continuous part of said first region, said second region having the same conductivity type as that of said first region but having a higher conductance than that of said first region, and a third region of a second conductivity type formed in said first region so as to define a PN junction with said first region, the improvement comprising:

providing on the surface of said semiconductor substrate a first insulating surface coating having a first opening extending to the surface of said semiconductor substrate;

diffusing a first impurity determining said first conductivity type through said first opening into said semiconductor substrate thereby forming said first region;

forming a second insulating surface coating on that surface portion of said first region which lies within said first opening;

forming through said second surface coating a second opening extending to said first region;

diffusing a second impurity, determining said first conductivity type and having a higher diffusion velocity than that of said first impurity, through said second opening into said semiconductor substrate thereby forming said second region.

17. In the method of claim 16, the improvement additionally comprising:

forming in said second insulating surface coating a third opening extending to said first region;

and then diffusing a third impurity having said second conductivity type through said third opening into said first region to form said third region.

18. A method of making a semiconductor device according to claim 16, in which said semiconductor substrate is made from silicon, said first insulating surface coating consists of silicon compound, and said second insulating surface coating consists mainly of silicon oxide.

19. A method of making a semiconductor device according to claim 16, in which said semiconductor substrate is made from silicon, said first impurity is antimony, and said second impurity is phosphorus.

20. A method for making a transistor comprising the steps of selectively diffusing a first impurity determining a first conductivity type into a major surface of a semiconductor substrate having a second conductivity type opposite to said first conductivity type to form a heavily doped region of said first conductivity type in the major surface;

diffusing a second impurity determining said first conductivity type having a diffusion velocity higher than that of said first impurity into said major surface of said substrate to form a base region underlying and contiguous to said heavily doped region; and diffusing a third impurity determining said second conductivity type into said base region to form an emitter region.

21. A method for making a transistor comprising the steps of forming on a major surface of a semiconductor substrate having a first conductivity type a first insulating surface coating having a first hole exposing a surface portion of said substrate which surrounds a center portion of the major surface of said substrate;

introducing a first impurity determining a second conductivity type opposite to said first conductivity type through said first hole into said major surface of said substrate to form a heavily doped region surrounding said center portion of said major surface;

forming in said first insulating surface coating a second hole including said first hole and having an area larger than that of said first hole to expose the major surface of said substrate;

introducing a second impurity determining said second conductivity type and having a diffusion velocity higher than that of said first impurity through said second hole to form a base region underlying and contiguous to said heavily doped region;

forming a second insulating surface coating in said second hole to cover said base region and said heavily doped region;

forming in said second insulating surface coating a third hole extending to said center portion of said major surface; and introducing a third impurity determining said first conductivity type through said third hole said base region to form an emitter region surrounded with said heavily doped region.

22. A method for manufacturing a transistor comprising the steps of covering a major surface of a semiconductor substrate of a first conductivity type with an insulatnig surface coating having a first hole exposing a surface portion of said major surface which surrounds a center portion of the major surface;

introducing a first impurity determining a second conductivity type opposite to said first conductivity type through said first hole into said substrate to form a heavily doped region surrounding said center portion of said major surface;

covering said major surface in said first hole with another insulating surface coating;

introducing a second impurity determining said second conductivity type, which has a higher diffusion velocity than that of said first impurity and is not masked by said surface coatings, through said insulating surface coatings into said semiconductor substrate to form a base region of said second conductivity type underlying and contiguous to said heavily doped region;

forming a second hole exposing said center portion of said major surface in said insulating surface coating; and introducing a third impurity determining said first conductivity type through said second hole into said base region to form an emitter region surrounded with said heavily doped region.

23. A method for manufacturing a transistor comprising the steps of covering a major surface of a semiconductor substrate of a first conductivity type with an insulating surface coating having a first hole exposing a surface portion of said major surface which surrounds a center portion of the major surface;

introducing a first impurity determining a second conductivity type opposite to said first conductivity type through said first hole into said substrate to form a heavily doped region surrounding said center portion of said major surface;

forming in said insulating surface coating a second hole exposing said heavily doped region and said center portion of said major surface;

introducing a second impurity determining said second conductivity type and having a diffusion velocity higher than that of said first impurity through said second hole into said substrate to form a base region of said second conductivity type underlying and contiguous to said heavily doped region;

covering said second hole with another insulating surface coating;

forming a third hole exposing said center portion of said major surface in said other insulating surface coating; and introducing a third impurity determining said first conductivity type through said third hole into said base region to form an emitter region surrounded with said heavily doped region.

24. A method for manufacturing a transistor comprising the steps of covering a major surface of a semiconductor substrate having a first conductivity type with a first insulating surface coating having a first hole extending to said major surface;

introducing a first impurity determining a second conductivity type opposite to said first conductivity type through said first hole into said substrate to form a base region;

covering said first hole with a second insulating surface coating having a second hole exposing a surface portion of said base region so as to surround a center surface portion of said base region;

introducing a second impurity of said second conductivity type but having a diffusion velocity higher than that of said first impurity through said second hole into said base region to form a heavily doped region surrounding said center surface portion of said base region;

covered said second hole with a third insulating surface coating;

forming in said second surface coating a third hole exposing said center surface portion of said base region; and introducing a third impurity determining said first conductivity type through said third hole into said base region to form an emitter region surrounded with said heavily doped region.

25. A method of manufacturing a transistor comprising the steps of covering a major surface of a semiconductor substrate having a first conductivity type with a first insulating surface coating having a first hole extending to said major surface;

introducing a first impurity determining a second conductivity type opposite to said first conductivity type through said first hole into said substrate to form a base region;

covering said first hole with a second insulating surface coating having a second hole exposing center surface portion of said base region;

introducing a second impurity determining said first conductivity type through said second hole into said base region to form an emitter region;

covering said second hole with a third insulating surface coating;

forming in said second insulating surface coating a third hole exposing a surface portion of said base region so as to surround said emitter region; and introducing a third impurity determining said second conductivity type but having a diffusion velocity higher than that of said first impurity to form a heavily doped region surrounding said emitter region.

References Cited

UNITED STATES PATENTS

| | | | |
|---|---|---|---|
| 2,802,760 | 8/1957 | Derick et al. | 148—190 |
| 3,104,991 | 9/1963 | MacDonald | 148—187 |
| 3,183,128 | 5/1965 | Leistiko et al. | 148—187 |
| 3,347,720 | 10/1967 | Bryan et al. | 148—187 |
| 3,394,037 | 7/1968 | Robinson | 148—187 |

L. DEWAYNE RUTLEDGE, Primary Examiner

R. A. LESTER, Assistant Examiner

U.S. Cl. X.R.

29—578; 148—190